(12) United States Patent  (10) Patent No.: US 8,040,173 B2
Ikebe et al.  (45) Date of Patent: Oct. 18, 2011

(54) REFERENCE SIGNAL GENERATOR CIRCUIT WITH FILTER-LESS QUADRATURE MIXERS FOR WIDE-BAND APPLICATIONS

(75) Inventors: Masayuki Ikebe, Sapporo (JP); Eiichi Sano, Sapporo (JP); Masato Koutani, Osaka (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 0 days.

(21) Appl. No.: 12/704,803

(22) Filed: Feb. 12, 2010

(65) Prior Publication Data

US 2010/0225375 A1  Sep. 9, 2010

(30) Foreign Application Priority Data

Mar. 9, 2009 (JP) ................................. 2009-055045

(51) Int. Cl.
*G06G 7/12* (2006.01)
(52) U.S. Cl. .................... 327/355; 327/361; 455/326
(58) Field of Classification Search .......... 327/355–361; 455/323, 326
See application file for complete search history.

(56) References Cited

U.S. PATENT DOCUMENTS

| 5,861,781 | A  | * | 1/1999 | Ashby | ........................... | 332/170 |
| 6,693,980 | B1 |   | 2/2004 | Linder et al. | | |
| 7,130,599 | B2 |   | 10/2006 | Persico et al. | | |
| 7,321,268 | B2 |   | 1/2008 | Chang et al. | | |
| 7,519,349 | B2 | * | 4/2009 | Sridharan | ..................... | 455/285 |
| 2003/0220086 | A1 | * | 11/2003 | Birkett | .......................... | 455/260 |

FOREIGN PATENT DOCUMENTS

| JP | 2004-523142 | 7/2004 |
| JP | 2004-356927 | 12/2004 |
| JP | 2004-536471 | 12/2004 |
| JP | 2007-295068 | 11/2007 |

OTHER PUBLICATIONS

Geum-Young Tak et al., "*A 6.3-9-GHz CMOS Fast Settling PLL for MB-OFDM UWB Applications*", IEEE Journal of Solid-state Circuits, vol. 40, No. 8, pp. 1671-1679, Aug. 2005.

* cited by examiner

*Primary Examiner* — Dinh T. Le
(74) *Attorney, Agent, or Firm* — Wenderoth, Lind & Ponack, L.L.P.

(57) ABSTRACT

A first mixer circuit mixes a first center frequency signal with a first local oscillation signal to generate a second mixed signal, and mixes the first center frequency signal with a second local oscillation signal to generate a first mixed signal, and a second mixer circuit mixes a second center frequency signal with the first local oscillation signal to generate a fourth mixed signal, and mixes the second center frequency signal with the second local oscillation signal to generate a third mixed signal. An adder and subtracter circuit subtracts the third mixed signal from the second mixed signal to output a signal of subtraction result as a first upper side band signal, and adds the first mixed signal to the fourth mixed signal to output a signal of addition result as a second upper side band signal different in phase from the first upper side band signal by 90 degrees.

4 Claims, 8 Drawing Sheets

Fig.3

| Vc1 | Vc2 | T1 | | T2 | | T3 | | T4 | |
|---|---|---|---|---|---|---|---|---|---|
| DON'T CARE | | Ic | -Ic | | | Qc | | -Qc | |
| H | H | | $Iu=E2-E3$ | | $-Iu=-(E2-E3)$ | | $Qu=E1+E4$ | | $-Qu=-(E1+E4)$ |
| L | L | | $I\ell=E2+E3$ | | $-I\ell=-(E2+E3)$ | | $Q\ell=E1-E4$ | | $-Q\ell=-(E1-E4)$ |

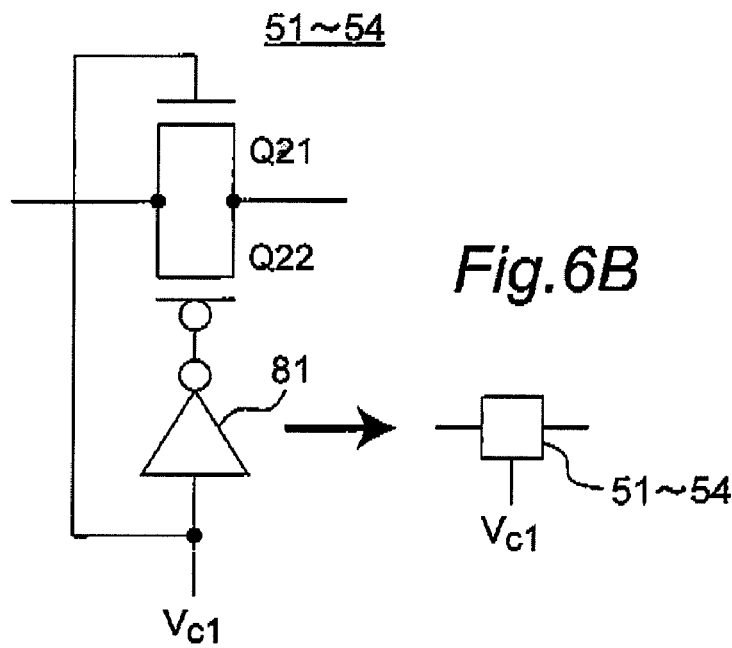
*Fig.6A*  *Fig.6B*
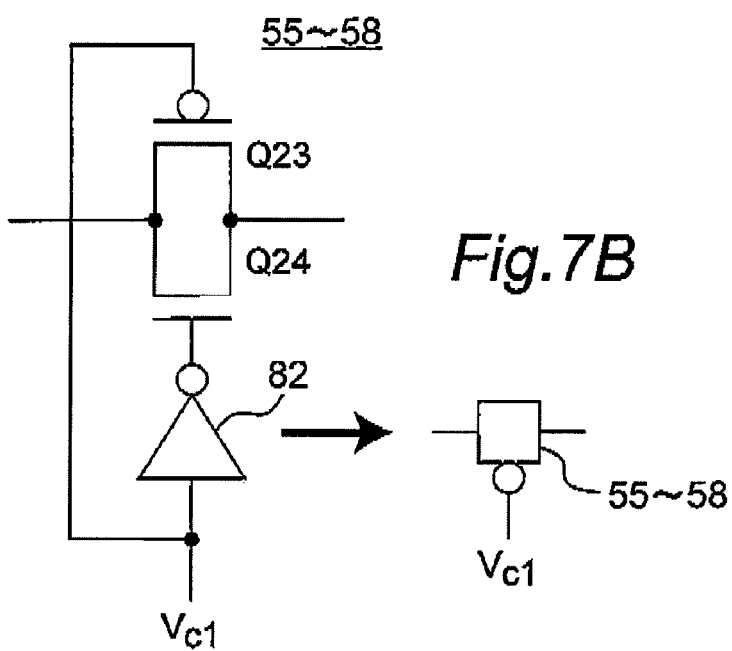
*Fig.7A*  *Fig.7B*

REFERENCE SIGNAL GENERATOR CIRCUIT WITH FILTER-LESS QUADRATURE MIXERS FOR WIDE-BAND APPLICATIONS

BACKGROUND OF THE INVENTION

1. Field of the Invention

The present invention relates to a reference signal generator circuit for use in, e.g., a wireless communication system, and in particular, a reference signal generator provided with two 90-degree phase shifters and two mixer circuits.

2. Description of the Related Art

In MB-OFDM (Multi-Band Orthogonal Frequency Division Multiplexing) which is a scheme for a UWB (Ultra Wide Band) system, as shown in FIG. 8, a frequency band (a band) in a range from 3.1 GHz to 10.6 GHz is divided into five groups G1 to G5. Each of the groups G1 to G5 has three sub-frequency bands (subbands) and requires high-rate frequency switching of 9.2 nanoseconds. Conventionally, oscillators for handling the seven subbands (B1 to B7 and B8 to B14) have been proposed in such a manner that wide-band PLL circuits are switched or a plurality of SSB mixers are used.

FIG. 9 is a circuit diagram showing a configuration of a conventional reference signal generator circuit for use in a wireless communication system. FIG. 10 is a spectrum diagram showing a reference signal generated by the reference signal generator circuit shown in FIG. 9. Referring to FIG. 9, the reference signal generator circuit is configured to include a center frequency oscillator 90 for generating a reference signal having a center frequency fc, mixers 91 and 92, a shift frequency oscillator 93 for generating a local oscillation signal having a shift frequency Δf, a 90-degree phase shifter 94, low pass filters (LPFs) 95 and 97, high pass filters (HPFs) 96 and 98, and multiplexers 99 and 100 for selectively switching between two input signals in accordance with a selection signal Ss to output reference signals S1 and S2.

In the reference signal generator circuit configured as described above, the mixers 91 and 92 output mixed signals M1 and M2, respectively, and the mixed signals M1 and M2 are expressed by the following equations:

$$M1 = \sin(2\pi\Delta ft) \times \cos(2\pi fct) \quad (1)$$
$$= (1/2)\{\sin(2\pi(fc + \Delta f)t) - \sin(2\pi(fc - \Delta f)t)\}$$
$$= (1/2)(H1 - L1),$$

and $$M2 = \cos(2\pi\Delta ft) \times \cos(2\pi fct) \quad (2)$$
$$= (1/2)\{\cos(2\pi(fc + \Delta f)t) + \cos(2\pi(fc - \Delta f)t)\}$$
$$= (1/2)(H2 + L2),$$

where, H1 and H2 denote upper side band signals outputted from the HPFs 96 and 98, respectively, and L1 and L2 denote lower side band signals outputted from the LPFs 95 and 97, respectively. The multiplexers 99 and 100 selectively switch between the two input signals to output reference signals S1 and S2 called an I signal and a Q signal which are different in phase from each other by 90 degrees.

Documents related to the present invention are as follows:
(a) Patent Document 1: Japanese Patent Laid-open Publication No. 2004-523142;
(b) Patent Document 2: Japanese Patent Laid-open Publication No. 2007-295068;
(c) Patent Document 3: U.S. Pat. No. 7,321,268; and
(d) Non-patent Document 1: Geum-Young Tak et al., "A 6.3-9-GHz CMOS Fast Setting PLL for MB-OFDM UWB Applications", IEEE Journal of Solid-state Circuits, Vol. 40, No. 8, August 2005.

However, the use of the wide-band PLL circuit requires control of wide-band frequencies for the plurality of groups and control of fine frequencies corresponding to the subbands. Consequently, this case makes it considerably difficult to cover all the groups in the MB-OFDM (e.g., See Non-patent Document 1). In addition, when a normal mixer is used, a filter is required (e.g., See FIG. 9). Alternatively, this case requires four or more SSB mixers (e.g., See Patent Document 2). Hence, there is a problem of increase in circuit scale.

In addition, the case where the filters 95 to 98 are used in accordance with the conventional example shown in FIG. 9 causes the following problem. For example, if the shift frequency Δf is relatively small, a signal from one filter can not be completely separated from a signal from another filter with ease, as shown in FIG. 10.

SUMMARY OF THE INVENTION

It is an object of the present invention to solve the problems described above and to provide a reference signal generator circuit capable of generating a plurality of reference signals, which are different from each other by a predetermined shift frequency and are completely separated from each other, with a simple circuit configuration using no filters, unlike a conventional reference signal generator circuit.

In order to achieve the aforementioned objective, according to one aspect of the present invention, there is provided a reference signal generator circuit including first and second signal generators, first and second phase shifters, first and second mixer circuits, and an adder and subtractor circuit.

The first signal generator circuit generates a first center frequency signal having a center frequency, and the first phase shifter shifts a phase of the first center frequency signal by 90 degrees to generate a second center frequency signal. The second signal generator circuit generates a first local oscillation signal having a shift frequency, and the second phase shifter shifts a phase of the first local oscillation signal by 90 degrees to generate a second local oscillation signal. The first mixer circuit mixes the first center frequency signal with the first local oscillation signal to generate a second mixed signal, and mixes the first center frequency signal with the second local oscillation signal to generate a first mixed signal. The second mixer circuit mixes the second center frequency signal with the first local oscillation signal to generate a fourth mixed signal, and mixes the second center frequency signal with the second local oscillation signal to generate a third mixed signal.

The adder and subtracter circuit in a first case, (a) subtracts the third mixed signal from the second mixed signal to output a signal of subtraction result as a first upper side band signal, and (b) adds the first mixed signal to the fourth mixed signal to output a signal of addition result as a second upper side band signal which is different in phase from the first upper side band signal by 90 degrees. The adder and subtractor circuit in a second case, (c) adds the second mixed signal to the third mixed signal to output a signal of addition result as a first lower side band signal, and (d) subtracts the fourth mixed signal from the first mixed signal to output a signal of subtraction result as a second lower side band signal which is different in phase from the first lower side band signal by 90 degrees.

The above-mentioned reference signal generator circuit preferably further includes a switch circuit in a third case, for outputting the first and second center frequency signals in place of the first and second upper side band signals and the first and second lower side band signals, which are outputted from the adder and subtracter circuit.

In the above-mentioned reference signal generator circuit, the first mixer circuit and the second mixer circuit are preferably combined as a quadrature mixer with shared transconductance stage.

In addition, in the above-mentioned reference signal generator circuit, the reference signal generator circuit is preferably configured with one of a differential circuit and a CMOS differential circuit.

Accordingly, the reference signal generator circuit according to the present invention can generate a plurality of reference signals, which are different from each other by a predetermined shift frequency, are different in phase from each other by 90 degrees, and are completely separated from each other, with a simple circuit configuration using no filters, unlike a conventional reference signal generator circuit. In addition, the switch circuit is configured with, e.g., a transistor, so that the plurality of reference signals can be selectively switched at a high rate.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 3 is a table showing signals outputted from output terminals T1, T2, T3 and T4 selected in accordance with control voltages Vc1 and Vc2 in the reference signal generator circuit shown in FIG. 1;

FIG. 6A is a circuit diagram showing a detailed circuit configuration of switch devices 51 to 54 shown in FIG. 5;

FIG. 6B is a diagram showing each symbol of the switch devices 51 to 54;

FIG. 7A is a circuit diagram showing a detailed circuit of switch devices 55 to 58 shown in FIG. 5;

FIG. 7B is a diagram showing each symbol of the switch devices 55 to 58;

DETAILED DESCRIPTION OF THE INVENTION

With reference to the drawings, hereinafter, description will be given of preferred embodiments of the present invention. It is to be noted that like constituent elements are described with an identical reference mark in the respective preferred embodiments to be described below.

Figure 1:
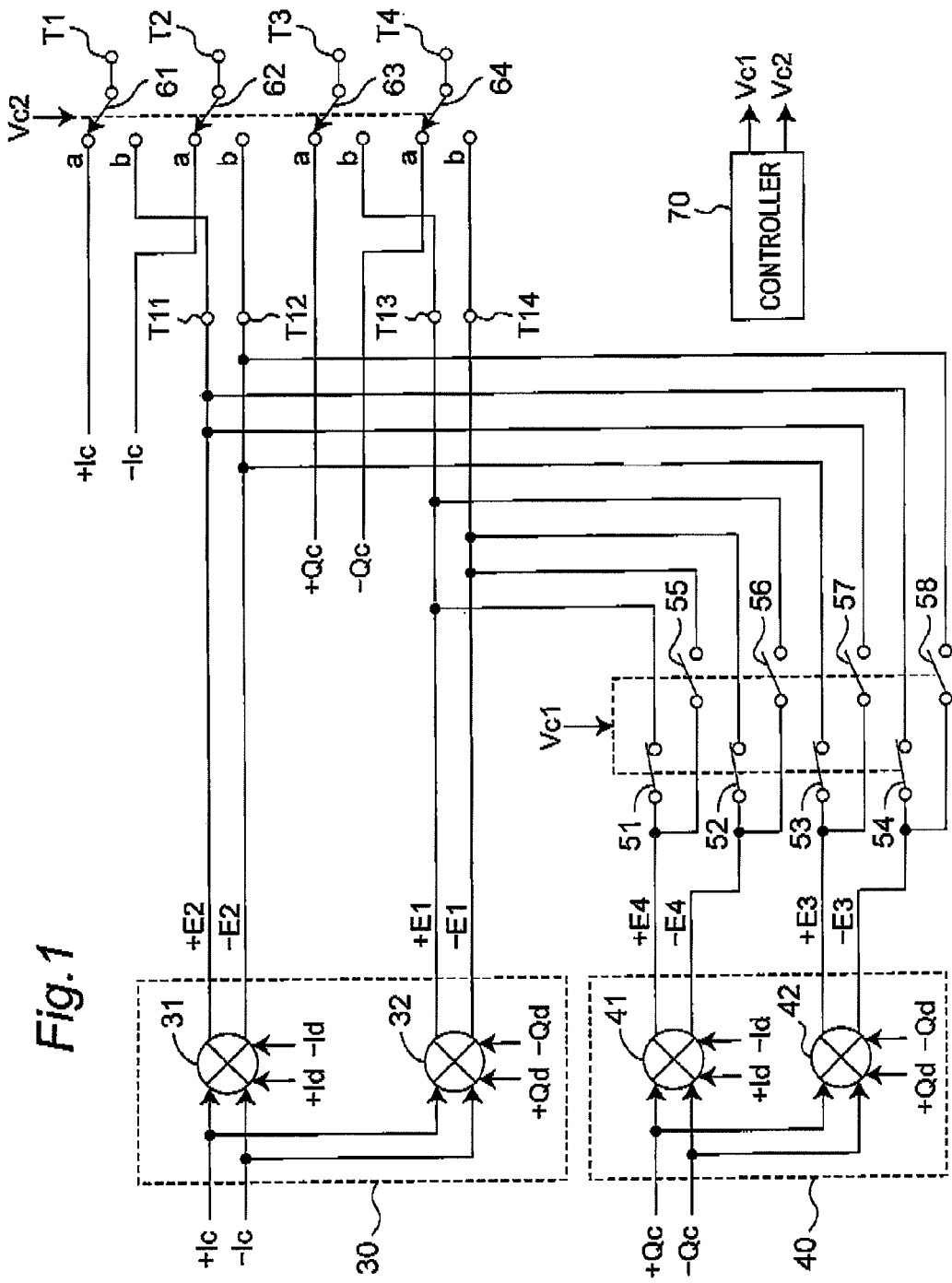
FIG. 1 is a circuit diagram showing a first portion of a configuration of a reference signal generator circuit for use in a wireless communication system, according to one preferred embodiment of the present invention.
Figure 2:
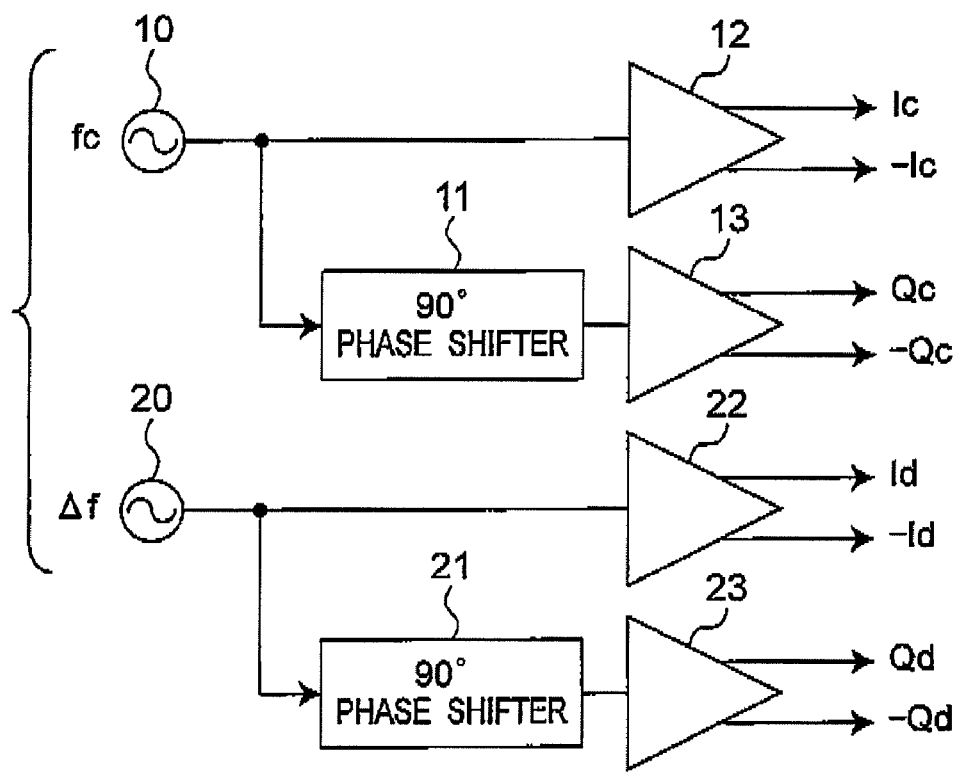
FIG. 2 is a circuit diagram showing a second portion of the reference signal generator circuit shown in FIG. 1.

FIG. 1 is a circuit diagram showing a first portion of a configuration of a reference signal generator circuit for use in a wireless communication system, according to the preferred embodiment of the present invention. FIG. 2 is a circuit diagram showing a second portion of the reference signal generator circuit shown in FIG. 1. The reference signal generator circuit shown in FIGS. 1 and 2 is configured to include a center frequency oscillator 10, a shift frequency oscillator 20, two 90-degree phase shifters 11 and 21, four differential buffer amplifiers 12, 13, 22 and 23, a differential quadrature mixer circuit 30 configured with mixers 31 and 32, a differential quadrature mixer circuit 40 configured with mixers 41 and 42, switch devices 51 to 58 and 61 to 64 each configured with a CMOS circuit, and a controller 70 for controlling the switch devices 51 to 58 and 61 to 64.

Referring to FIG. 2, the center frequency oscillator 10 generates a reference signal having a predetermined center frequency fc to output the reference signal to the differential buffer amplifier 12, and also, to output the reference signal to the differential buffer amplifier 13 via the 90-degree phase shifter 11. The differential buffer amplifier 12 buffers and amplifies the input signal to generate two center frequency signals Ic and −Ic having a mutually differential relation, and outputs the center frequency signals Ic and −Ic to the mixers 31 and 32 of the differential quadrature mixer circuit 30 shown in FIG. 1. In addition, the differential buffer amplifier 13 buffers and amplifies the input signal to generate two center frequency signals Qc and −Qc having a mutually differential relation, and outputs the center frequency signals Qc and −Qc to the mixers 41 and 42 of the differential quadrature mixer circuit 40 shown in FIG. 1. The shift frequency oscillator 20 generates a local oscillation signal having a predetermined shift frequency Δf to output the local oscillation signal to the differential buffer amplifier 22, and also, to output the local oscillation signal to the differential buffer amplifier 23 via the 90-degree phase shifter 21. The differential buffer amplifier 22 buffers and amplifies the input signal to generate two local oscillation signals Id and −Id having a mutually differential relation, and outputs the local oscillation signals Id and −Id to the mixer 31 of the differential quadrature mixer circuit 30 shown in FIG. 1 and the mixer 41 of the differential quadrature mixer circuit 40 shown in FIG. 1. In addition, the differential buffer amplifier 23 buffers and amplifies the input signal to generate two center frequency signals Qd and −Qd having a mutually differential relation, and outputs the center frequency signals Qd and −Qd to the mixer 32 of the differential quadrature mixer circuit 30 shown in FIG. 1 and the mixer 42 of the differential quadrature mixer circuit 40 shown in FIG. 1.

Referring to FIG. 1, the mixer 31 of the differential quadrature mixer circuit 30 has at least second-order non-linear input and output characteristic. The mixer 31 performs a multiplying operation by mixing the center frequency signals Ic and −Ic with the local oscillation signals Id and −Id, and generates and outputs mixed signals E2 and −E2 having a mutually differential relation. In this case, the mixed signal E2 is outputted to a terminal T11 and to an output terminal T1 via a contact "b" of the switch device 61. On the other hand, the mixed signal −E2 is outputted to a terminal T12 and to an output terminal T2 via a contact "b" of the switch device 62.

In addition, the mixer 32 of the differential quadrature mixer circuit 30 has at least second-order non-linear input and output characteristic. The mixer 32 performs a multiplying operation by mixing the center frequency signals Ic and −Ic with the local oscillation signals Qd and −Qd, and generates and outputs mixed signals E1 and −E1 having a mutually differential relation. In this case, the mixed signal E1 is outputted to a terminal T13 and to an output terminal T3 via a contact "b" of the switch device 63. On the other hand, the mixed signal −E1 is outputted to a terminal T14 and to an output terminal T4 via a contact "b" of the switch device 64.

Further, the mixer 41 of the differential quadrature mixer circuit 40 has at least second-order non-linear input and output characteristic. The mixer 41 performs a multiplying operation by mixing the center frequency signals Qc and −Qc with the local oscillation signals Id and −Id, and generates and outputs mixed signals E4 and −E4 having a mutually differential relation. In this case, the mixed signal E4 is outputted to the switch device 51, to the terminal T13, and to the output terminal T3 via the contact "b" of the switch device 63. The mixed signal E4 is also outputted to the switch device 55, to the terminal T14, and to the output terminal T4 via the contact "b" of the switch device 64. In addition, the mixed signal −E4 is outputted to the switch device 52, to the terminal T14, and to the output terminal T4 via the contact "b" of the switch device 64. The mixed signal −E4 is also outputted to the switch device 56, to the terminal T13, and to the output terminal T3 via the contact "b" of the switch device 63.

Furthermore, the mixer 42 of the differential quadrature mixer circuit 40 has at least second-order non-linear input and output characteristic. The mixer 42 performs a multiplying operation by mixing the center frequency signals Qc and −Qc with the local oscillation signals Qd and −Qd, and generates and outputs mixed signals E3 and −E3 having a mutually differential relation. In this case, the mixed signal E3 is outputted to the switch device 53, to the terminal T12, and to the output terminal 72 via the contact "b" of the switch device 62. The mixed signal E3 is also outputted to the switch device 57, to the terminal T11, and to the output terminal T1 via the contact "b" of the switch device 61. In addition, the mixed signal −E3 is outputted to the switch device 54, to the terminal T11, and to the output terminal T1 via the contact "b" of the switch device 61. The mixed signal −E3 is also outputted to the switch device 58, to the terminal T12, and to the output terminal T2 via the contact "b" of the switch device 62.

The controller 70 generates a control voltage Vc1, and outputs the control voltage Vc1 to the switch devices 51 to 58 to perform ON/OFF control. The controller 70 also generates a control voltage Vc2, and outputs the control voltage Vc2 to the switch devices 61 to 64 to perform ON/OFF control. For example, when the controller 70 generates a control voltage Vc2 having an H level such as a direct-current voltage $V_{DD}$, a contact "a" is selected in the switch devices 61 to 64. On the other hand, when the controller 70 generates a control voltage Vc2 having an L level such as a ground voltage, the contact "b" is selected in the switch devices 61 to 64. In addition, when the controller 70 generates a control voltage Vc1 having the H level such as a direct-current voltage $V_{DD}$, the switch devices 51 to 54 are turned on whereas the switch devices 55 to 58 are turned off. Further, when the controller 70 generates a control voltage Vc1 having the L level such as a ground voltage, the switch devices 51 to 54 are turned off whereas the switch devices 55 to 58 are turned on. Each of the terminals T11, T12, T13 and T14 performs an adding operation or a subtracting operation on electric currents from the respective mixers 31, 32, 41 and 42 in accordance with the ON state or the OFF state of the switch devices 51 to 58 to generate a signal having a voltage level corresponding to each electric current.

FIG. 3 is a table showing signals outputted from the output terminals T1, T2, T3 and T4 selected in accordance with the control voltages Vc1 and Vc2 in the reference signal generator circuit shown in FIG. 1. It is apparent from FIG. 3 that when the control voltage Vc2 has the H level, the contact "a" is selected in the switch devices 61 to 64, so that the center frequency signals Ic, −Ic, Qc and −Qc are outputted from the terminals T1, T2, T3 and T4, respectively. On the other hand, when the control voltage Vc2 has the L level, the contact "b" is selected in the switch devices 61 to 64, so that upper side band signals (Iu, −Iu, Qu, −Qu) or lower side band signals (π, −π, Q1, −Q1) corresponding to reference signals according to the ON state or the OFF state of the switch devices 51 to 58 are outputted from the output terminals T1 to T4, respectively. In FIG. 3, the signals E1 to E4 as well as these addition and subtraction signals are expressed by the following equations:

$$E1 = \sin(2\pi \Delta ft) \times \cos(2\pi fct) \qquad (3)$$
$$= (1/2)\{\sin(2\pi(fc+\Delta f)t) - \sin(2\pi(fc-\Delta f)t)\},$$

$$E2 = \cos(2\pi \Delta ft) \times \cos(2\pi fct) \qquad (4)$$
$$= (1/2)\{\cos(2\pi(fc+\Delta f)t) + \cos(2\pi(fc-\Delta f)t)\},$$

$$E3 = \sin(2\pi \Delta ft) \times \sin(2\pi fct) \qquad (5)$$
$$= (1/2)\{-\cos(2\pi(fc+\Delta f)t) + \cos(2\pi(fc-\Delta f)t)\},$$

$$E4 = \cos(2\pi \Delta ft) \times \sin(2\pi fct) \qquad (6)$$
$$= (1/2)\{\sin(2\pi(fc+\Delta f)t) + \sin(2\pi(fc-\Delta f)t)\},$$

$$Iu = E2 - E3 = \cos((fc+\Delta f)t), \qquad (7)$$

$$Qu = E1 + E4 = \sin((fc+\Delta f)t), \qquad (8)$$

$$I1 = E2 + E3 = \cos((fc-\Delta f)t), \qquad (9)$$

and $$Q1 = E1 - E4 = \cos((fc-\Delta f)t). \qquad (10)$$

Figure 4:
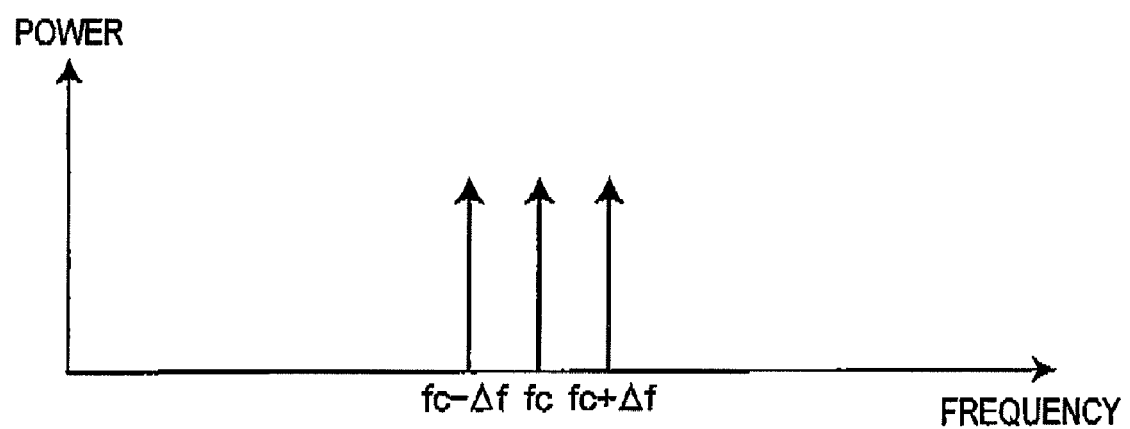
FIG. 4 is a spectrum diagram showing a reference signal generated by the reference signal generator circuit shown in FIG. 1.

According to the reference signal generator circuit configured as described above, the center frequency signal having the center frequency fc, the signal whose phase is shifted by 90 degrees, and the two local oscillation signals which are different in phase from each other by 90 degrees and have the shift frequency Δf are inputted to the differential quadrature mixer circuits 30 and 40 to be mixed with each other, and the resultant mixed signals are subjected to the adding operation or the subtracting operation. Thus, the reference signal having the center frequency fc and the reference signals having the side band frequencies fc±Δf, which are selected at a high rate and are completely separated from each other without use of filters, can be generated at the output terminals T1 to T4, as shown in FIG. 4. Accordingly, the present invention proposes a novel scheme suitable for a UWB synthesizer that requires high-rate frequency hopping.

In the reference signal generator circuit, the use of the differential quadrature mixer circuits 30 and 40 simultaneously allows some advantageous effects such as control of fine frequencies corresponding to subbands based on signal calculation by simple interconnections, elimination of filters, and correction of orthogonality of signals. Moreover, in MB-OFDM application, the reference signal generator circuit can handle seven or more bands with an oscillator configuration (including a PLL configuration) in about or less than 10 GHz while the configuration thereof is made compact. That is, the reference signal generator circuit according to the present preferred embodiment can generate a plurality of reference signals, which are different from each other by a predetermined shift frequency and are completely separated from each other, with a simple circuit configuration using no filters, wake a conventional reference signal generator circuit.

IMPLEMENTAL EXAMPLE

Figure 5:
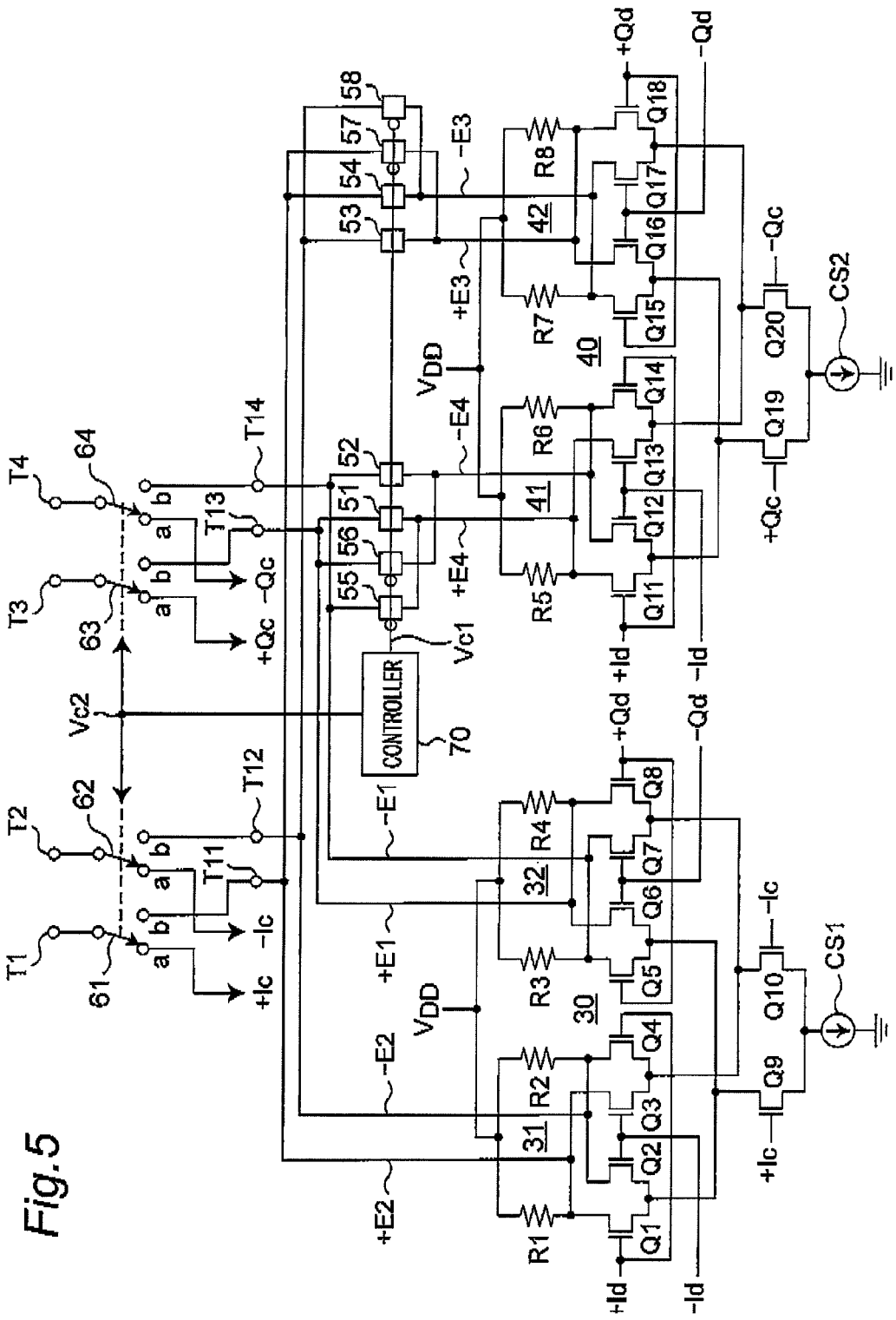
FIG. 5 is a circuit diagram showing a configuration of an implemental example in which the reference signal generator circuit shown in FIG. 1 employs a CMOS circuit configuration.
Figure 8:
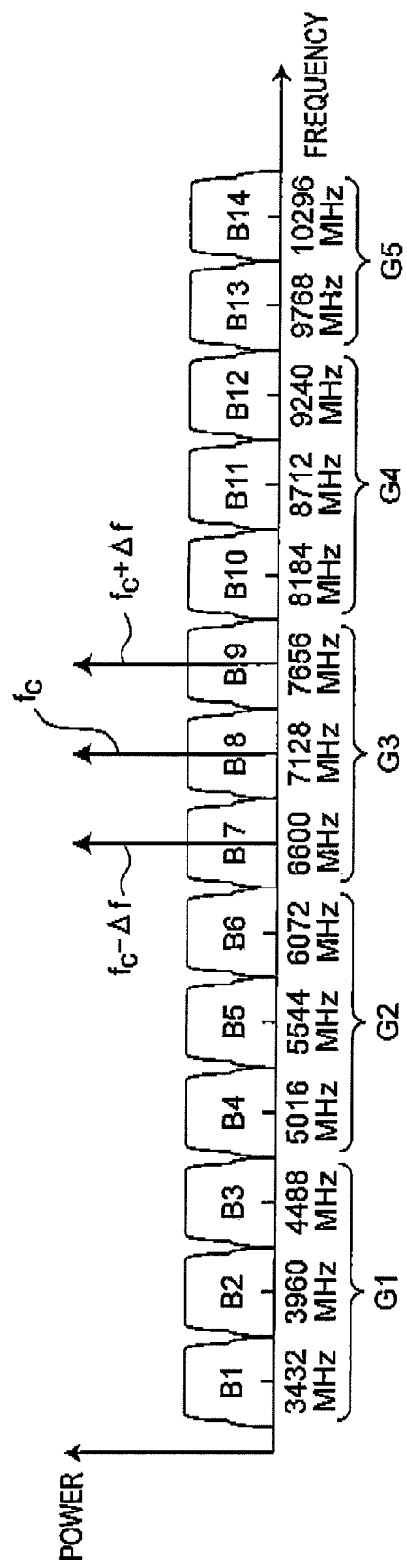
FIG. 8 is a spectrum diagram showing a frequency band in conventional UWB-OFDM.
Figure 9:
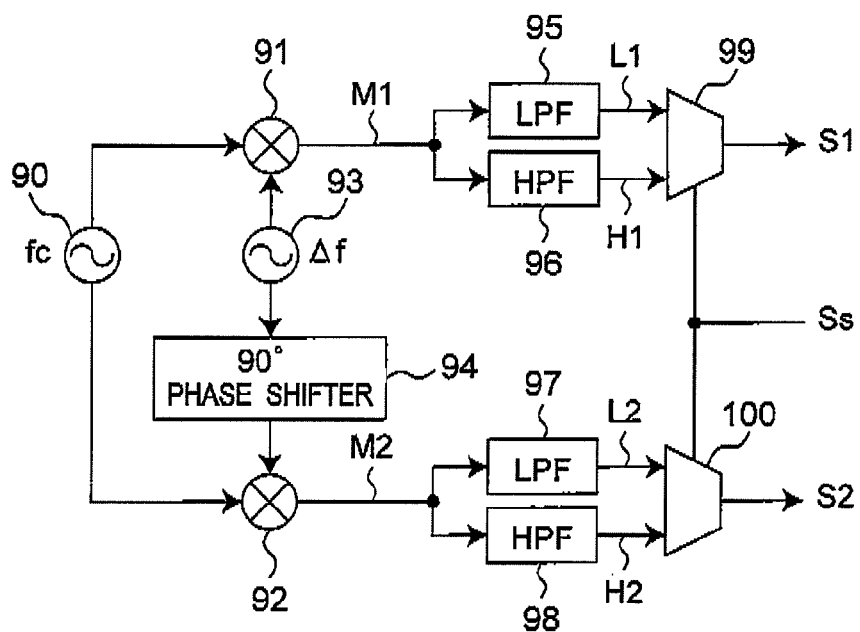
FIG. 9 is a circuit diagram showing a configuration of a conventional reference signal generator circuit for use in a wireless communication system.
Figure 10:
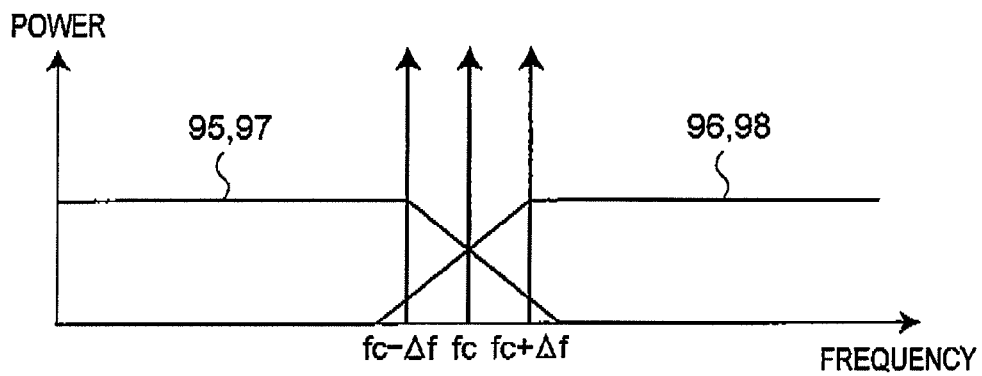
FIG. 10 is a spectrum diagram showing a reference signal generated by the reference signal generator circuit shown in FIG. 9.

FIG. 5 is a circuit diagram showing a configuration of an implemental example in which the reference signal generator circuit shown in FIG. 1 employs a CMOS circuit configuration. In FIG. 5, constituent elements similar to those shown in FIGS. 1 and 2 are shown with the identical numeral reference, and therefore description thereof will not be given.

Referring to FIG. 5, a differential quadrature mixer circuit 30 is configured to include a mixer 31 configured with four n-channel MOS field effect transistors (hereinafter, referred to as nMOSFETs) Q1 to Q4, resistors R1 and R2, two nMOSFETs Q9 and Q10, and a current source CS1; and a mixer 32 configured with four nMOSFETs Q5 to Q8, resistors R3 and R4, the two nMOSFETs Q9 and Q10, and the current source CS1. In this case, the mixers 31 and 32 share use of the two nMOSFETs Q9 and Q10, and the current source CS1. In addition, a differential quadrature mixer circuit 40 is configured to include a mixer 41 configured with four nMOSFETs Q11 to Q14, resistors R5 and R6, two nMOSFETs Q19 and Q20, and a current source CS2; and a mixer 42 configured with four nMOSFETs Q15 to Q18; resistors R7 and R8, the two nMOSFETs Q19 and Q20, and the current source CS2. In this case, the mixers 41 and 42 share use of the two nMOSFETs Q19 and Q20, and the current source CS2.

It is to be noted that a voltage source of a direct-current voltage $V_{DD}$ is connected to drains of the nMOSFETs Q1 and Q3 via the resistor R1, and also, is connected to drains of the nMOSFETs Q2 and Q4 via the resistor R2. The voltage source of the direct-current voltage $V_{DD}$ is connected to drains of the nMOSFETs Q5 and Q7 via the resistor R3, and also, is connected to drains of the nMOSFETs Q6 and Q8 via the resistor R4. In addition, the voltage source of the direct-current voltage $V_{DD}$ is connected to drains of the nMOSFETs Q11 and Q13 via the resistor R5, and also, is connected to drains of the nMOSFETs Q12 and Q14 via the resistor R6. The voltage source of the direct-current voltage $V_{DD}$ is connected to drains of the nMOSFETs Q15 and Q17 via the resistor R7, and also, is connected to drains of the nMOSFETs Q16 and Q18 via the resistor R8. In this case, a node between the nMOSFET Q1 and the nMOSFET Q3 is connected to a terminal T11, and a node between the drain of the nMOSFET Q2 and the drain of the nMOSFET Q4 is connected to a terminal T12. A node between the drain of the nMOSFET Q5 and the drain of the nMOSFET Q7 is connected to a terminal T14, and a node between the drain of the nMOSFET Q6 and the drain of the nMOSFET Q8 is connected to a terminal T13. A node between the drain of the nMOSFET Q11 and the drain of the nMOSFET Q13 is connected to the terminal T13 via a switch device 51, and also, is connected to the terminal T14 via a switch device 55. A node between the drain of the nMOSFET Q12 and the drain of the nMOSFET Q14 is connected to the terminal T14 via a switch device 52, and also, is connected to the terminal T13 via a switch device 56. A node between the drain of the nMOSFET Q15 and the drain of the nMOSFET Q17 is connected to the terminal T11 via a switch device 54, and also, is connected to the terminal T12 via a switch device 58. A node between the drain of the nMOSFET Q16 and the drain of the nMOSFET Q18 is connected to the terminal T12 via a switch device 53, and also, is connected to the terminal T11 via a switch device 57. It is to be noted that the remaining configuration is similar to the circuit configuration shown in FIGS. 1 and 2.

FIG. 6A is a circuit diagram showing a detailed circuit configuration of the switch devices 51 to 54 shown in FIG. 5, and FIG. 6B is a diagram showing each symbol of the switch devices 51 to 54. Referring to FIG. 6A, each of the switch devices 51 to 54 is configured to include an nMOSFET Q21, a p-channel MOS field effect transistor (hereinafter, referred to as a pMOSFET) Q22 and an inverter 81. When a control voltage Vc1 has an H level, the switch devices 51 to 54 are turned on. On the other hand, when the control voltage Vc1 has an L level, the switch devices 51 to 54 are turned off.

FIG. 7A is a circuit diagram showing a detailed circuit configuration of the switch devices 55 to 58 shown in FIG. 5, and FIG. 73 is a diagram showing each symbol of the switch devices 55 to 58. Referring to FIG. 7A, each of the switch devices 55 to 58 is configured to include a pMOSFET Q23, an nMOSFET Q24 and an inverter 82. When the control voltage Vc1 has the H level, the switch devices 55 to 58 are turned off. On the other hand, when the control voltage Vc1 has the L level, the switch devices 55 to 58 are turned on.

In the reference signal generator circuit shown in FIG. 5, each of the differential quadrature mixer circuits 30 and 40 has such a circuit configuration that two Gilbert cell circuits are combined. The two mixer circuits 30 and 40 may be combined as a quadrature mixer with shared trans-conductance (gm) stage. Each of the differential quadrature mixer circuits 30 and 40 outputs a mixed signal of an I signal and a Q signal (a cosine wave and a sine wave) which are signals orthogonal to each other, and simultaneously, corrects orthogonality thereof by itself. The reference signal generator circuit shown in FIG. 5 operates in a manner similar to that of the reference signal generator circuit shown in FIG. 1, and has functions and advantageous effects similar to those of the reference signal generator circuit shown in FIG. 1.

In the foregoing preferred embodiment and implemental example, the reference signal generator circuit has the differential circuit configuration, however, the present invention is not limited thereto. The reference signal generator circuit may have a circuit configuration for a single signal.

AVAILABILITY OF INDUSTRIAL UTILIZATION

As described above in detail, the reference signal generator circuit according to the present invention can generate a plurality of reference signals, which are different from each other by a predetermined shift frequency, are different in phase from each other by 90 degrees, and are completely separated from each other, with a simple circuit configuration using no filters, unlike a conventional reference signal generator circuit. In addition, the switch circuit is configured with, e.g., a transistor, so that the plurality of reference signals can be selectively switched at a high rate. In particular, in a UWB wireless communication system, the reference signal generator circuit according to the present invention is suitably used as a circuit for generating a plurality of reference frequency signals in an MB-OFDM scheme or a wireless communication circuit for performing frequency hopping.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A reference signal generator circuit comprising:
   a first signal generator circuit for generating a first center frequency signal having a center frequency;
   a first phase shifter for shifting a phase of the first center frequency signal by 90 degrees to generate a second center frequency signal;
   a second signal generator circuit for generating a first local oscillation signal having a shift frequency;
   a second phase shifter for shifting a phase of the first local oscillation signal by 90 degrees to generate a second local oscillation signal;
   a first mixer circuit for mixing the first center frequency signal with the first local oscillation signal to generate a second mixed signal, and for mixing the first center frequency signal with the second local oscillation signal to generate a first mixed signal;
   a second mixer circuit for mixing the second center frequency signal with the first local oscillation signal to generate a fourth mixed signal, and for mixing the second center frequency signal with the second local oscillation signal to generate a third mixed signal;
   an adder and subtracter circuit for adding or subtracting mixed signals from among the first mixed signal, the second mixed signal, the third mixed signal, and the fourth mixed signal; and
   a switch circuit for switching an output between (i) an output of the adder and subtracter circuit and (ii) the first and second center frequency signals,
   wherein, in a first case, (i) the adder and subtracter circuit (a) subtracts the third mixed signal from the second mixed signal to output a signal of a subtraction result as a first upper side band signal, and (b) adds the first mixed signal to the fourth mixed signal to output a signal of an addition result as a second upper side band signal which is different in phase from the first upper side band signal by 90 degrees, and (ii) the switch circuit outputs the first upper side band signal and the second upper side band signal,
   wherein, in a second case, (i) the adder and subtracter circuit (c) adds the second mixed signal to the third mixed signal to output a signal of an addition result as a first lower side band signal, and (d) subtracts the fourth mixed signal from the first mixed signal to output a signal of a subtraction result as a second lower side band signal which is different in phase from the first lower side band signal by 90 degrees, and (ii) the switch circuit outputs the first lower side band signal and the second lower side band signal, and
   wherein, in a third case, the switch circuit outputs the first and second center frequency signals.

2. The reference signal generator circuit as claimed in claim 1,
   wherein the first mixer circuit and the second mixer circuit are combined as a quadrature mixer with a shared transconductance stage.

3. The reference signal generator circuit as claimed in claim 1,
   wherein the reference signal generator circuit is configured with one of a differential circuit and a CMOS differential circuit.

4. The reference signal generator circuit as claimed in claim 2,
   wherein the reference signal generator circuit is configured with one of a differential circuit and a CMOS differential circuit.

* * * * *